(12) United States Patent
Gleissner et al.

(10) Patent No.: US 10,829,863 B2
(45) Date of Patent: Nov. 10, 2020

(54) SUBSTRATE LOCKING SYSTEM, DEVICE AND PROCEDURE FOR CHEMICAL AND/OR ELECTROLYTIC SURFACE TREATMENT

(71) Applicant: Semsysco GmbH, Salzburg (AT)

(72) Inventors: Andreas Gleissner, Döbriach (AT); Thomas Wimsberger, Seeboden (AT); Herbert Ötzlinger, Hallwang (AT)

(73) Assignee: Semsysco GmbH, Salzburg (AT)

( * ) Notice: Subject to any disclaimer, the term of this patent is extended or adjusted under 35 U.S.C. 154(b) by 9 days.

(21) Appl. No.: 16/044,219

(22) Filed: Jul. 24, 2018

(65) Prior Publication Data
US 2019/0032234 A1 Jan. 31, 2019

(30) Foreign Application Priority Data

Jul. 27, 2017 (GB) .................................. 1712069.2

(51) Int. Cl.

| | |
|---|---|
| *C25D 17/06* | (2006.01) |
| *B05C 3/132* | (2006.01) |
| *C25D 5/34* | (2006.01) |
| *C25D 17/00* | (2006.01) |
| *C25D 5/08* | (2006.01) |
| *C25D 7/12* | (2006.01) |
| *H01L 21/288* | (2006.01) |
| *H01L 21/768* | (2006.01) |

(52) U.S. Cl.
CPC ............... *C25D 5/34* (2013.01); *B05C 3/132* (2013.01); *C25D 5/08* (2013.01); *C25D 7/12* (2013.01); *C25D 17/001* (2013.01); *C25D 17/004* (2013.01); *C25D 17/005* (2013.01); *C25D 17/06* (2013.01); *H01L 21/2885* (2013.01); *H01L 21/76841* (2013.01)

(58) Field of Classification Search
USPC ............... 118/400, 423, 427, 428, 429, 500; 204/297.02, 229.8, 228.1, 247.1, 155, 204/554, 557, 196.29
See application file for complete search history.

(56) References Cited

U.S. PATENT DOCUMENTS

| | | | | |
|---|---|---|---|---|
| 2002/0027080 | A1* | 3/2002 | Yoshioka | ............... C25D 17/02 205/123 |
| 2004/0150311 | A1* | 8/2004 | Jin | .......................... H01J 1/304 313/309 |
| 2015/0276835 | A1* | 10/2015 | Minami | ............... C25D 17/001 204/229.8 |

* cited by examiner

*Primary Examiner* — Yewebdar T Tadesse
(74) *Attorney, Agent, or Firm* — Hunton Andrews Kurth LLP

(57) ABSTRACT

Exemplary substrate locking system, device, apparatus and method for chemical and/or electrolytic surface treatment of a substrate in a process fluid can be provided. For example, it is possible to provide a first element, a second element and a locking unit. The first element and the second element can be configured to hold the substrate between each other. The locking unit can be configured to lock the first element and the second element with each other. The locking unit can comprise a magnet control device and a magnet. The magnet can be arranged at or near the first element and/or the second element. The magnet control device can be configured to control a magnetic force between the first element and the second element.

17 Claims, 10 Drawing Sheets

SUBSTRATE LOCKING SYSTEM, DEVICE AND PROCEDURE FOR CHEMICAL AND/OR ELECTROLYTIC SURFACE TREATMENT

CROSS-REFERENCE TO RELATED APPLICATION(S)

This application claims the benefit and priority Great Britain Patent Application No. 1712069.2 filed on Jul. 27, 2017, the entire disclosure of which is incorporated herein by reference.

FIELD OF THE DISCLOSURE

The present disclosure relates to a substrate locking system for chemical and/or electrolytic surface treatment of a substrate in a process fluid, a device for chemical and/or electrolytic surface treatment of a substrate in a process fluid, and a substrate locking method for chemical and/or electrolytic surface treatment procedure of a substrate in a process fluid.

BACKGROUND INFORMATION

In the semiconductor industry, various processes can be used to deposit or remove materials on or from the surface of wafers.

For example, electrochemical deposition (ECD) or electrochemical mechanical deposition (ECMD) processes can be used to deposit conductors, such as copper, on previously patterned wafer surfaces to fabricate device interconnect structures.

Chemical mechanical polishing (CMP) can be commonly used for a material removal step. Another technique, electropolishing or electroetching, can also be used to remove excess materials from the surface of the wafers.

Electrochemical (or electrochemical mechanical) deposition of materials on wafer surfaces or electrochemical (or electrochemical mechanical) removal of materials from the wafer surfaces are collectively called "electrochemical processing". Electrochemical, chemical and/or electrolytic surface treatment techniques may comprise electropolishing (or electroetching), electrochemical mechanical polishing (or electrochemical mechanical etching), electrochemical deposition and electrochemical mechanical deposition. All techniques utilize a process fluid.

Chemical and/or electrolytic surface treatment techniques can involve the following steps. A substrate to be processed is attached to a substrate holder, immersed into an electrolytic process fluid and serves as a cathode. An electrode can be immersed into the process fluid and serves as an anode. A direct current can be applied to the process fluid and dissociates positively charged metal ions at the anode. The ions can then migrate to the cathode, where they plate the substrate attached to the cathode.

A handling of such chemical and/or electrolytic surface treatment of a substrate in a process fluid can be improved. Hence, there may be a need to provide an improved system, device and method for chemical and/or electrolytic surface treatment of a substrate in a process fluid, which can improve a handling of the substrate.

SUMMARY OF EXEMPLARY EMBODIMENTS

At least such problem and other problems can be addressed by exemplary embodiments of the present disclosure. Various exemplary embodiments of the present disclosure can apply to the substrate locking system for chemical and/or electrolytic surface treatment of a substrate in a process fluid, the device for chemical and/or electrolytic surface treatment of a substrate in a process fluid, and the substrate locking method for chemical and/or electrolytic surface treatment of a substrate in a process fluid.

According to exemplary embodiments of the present disclosure, a substrate locking system for chemical and/or electrolytic surface treatment of a substrate in a process fluid can be provided.

The chemical and/or electrolytic surface treatment can be any material deposition, galvanized coating, chemical or electrochemical etching, anodal oxidation, metal separation or the like.

The exemplary substrate can comprise a conductor plate, a semi-conductor substrate, a film substrate, an essentially plate-shaped, metal or metallized workpiece or the like. A surface of the surface to be treated can be at least partially masked or unmasked.

The exemplary substrate locking system for chemical and/or electrolytic surface treatment can comprise a first element, a second element and a locking unit.

The first element and the second element can be configured to hold or otherwise maintain the substrate between each other. The first element can be or include a first contact ring and the second element may be a second contact ring, and they can hold or otherwise maintain one or more substrates between each other, either for single or dual side surface treatment. The first element can also be or include a substrate holder, and, e.g., only the second element can be a contact ring (in the following a so-called contact loop to distinguish this configuration). A second, different substrate can then be held on a rear side of the substrate holder.

The locking unit can be configured to lock the first element and the second element with each other. The locking unit can comprise a magnet control device and at least a magnet. The magnet can be arranged at one of the first element and the second element. The magnet control device can be configured to control a magnetic force between the first element and the second element. The magnet control device can influence the magnetic force to open the locking unit and to release the substrate from the substrate holder.

As a result, the substrate locking system according to the exemplary embodiments of the present disclosure for chemical and/or electrolytic surface treatment of a substrate in a process fluid can facilitate an easy handling of the substrate(s) and the substrate holder. In one exemplary, no outside screws or the like are needed. The substrate(s) can be very easily locked and hold by the substrate holder and unlocked and released. The exemplary procedure can be easily automated.

Further, the substrate(s) can be safely hold by the substrate holder, which can ease, e.g., a uniform material deposition during surface treatment, a transport of the substrate(s) in and protected by the substrate holder, etc. Consequently, the substrate locking system according to the exemplary embodiments of the present disclosure can improve the entire surface treatment procedure.

Further, the exemplary substrate locking system can be flexible, because such exemplary system can be used to treat either one or two substrates and, when surface treating one substrate, it can be used for either single or dual side surface treatment.

In an exemplary case, the first element and the second element can be or include two or more contact rings, respectively, holding one substrate between them. As an example, the first element can be or include a first contact ring, and the second element can be or include a second contact ring, both configured to hold one substrate between one another. The first element and the second element can hold the single substrate for single or dual side surface treatment. It is also possible to provide a surface treatment of passage holes or vias extending through the substrate.

In another exemplary case, the first element can be or include a substrate holder, and the second element may be or include a so-called contact loop. The contact loop can the same as a contact ring. The substrate holder can be configured to hold the substrate. The substrate holder can be configured to hold one (single or dual side surface treatment) or two substrates (one substrate on each side of the substrate holder). In such example, the first element can be or include a substrate holder, and the second element can be or include a contact loop. The substrate holder and the contact loop can be configured to hold one substrate between each other. This exemplary configuration can provide an additional stability.

Further, such exemplary configuration can be used for a surface treatment of two substrates at the same time. In that example, the substrate locking system for chemical and/or electrolytic surface treatment of a substrate can further comprise an additional contact loop configured to hold an additional substrate between a reverse side of the substrate holder and the additional contact loop. The substrate holder can then hold two substrates, one on each side of the substrate holder.

In another example, the magnet control device can be configured to control the magnetic force between the first element and the second element by applying a voltage. The magnet control device can be or include a computer processor. In a further example, the magnet control device can be configured to at least reduce the magnetic force of the permanent magnet to facilitate a release of the second element from the first element. In still another example, the magnet control device can be configured to eliminate or significantly reduce the magnetic force of the permanent magnet to facilitate a release of the second element from the first element. In yet another example, the magnet control device can be configured to reverse the magnetic force of the permanent magnet to facilitate a repelling of the second element relative to the first element. The magnet control device can thereby facilitate an opening of the locking unit and a release of the substrate(s) from the substrate holder.

According to another exemplary embodiment of the present disclosure, the magnet can be or include a permanent magnet configured to lock the first element to the second element. In an example, the magnet of the locking unit can be arranged at or near the first element. The magnet can also be arranged at the second element. In a further example, the locking unit can comprise several magnets distributed at the first element along a substrate to be held. This can improve a uniformity and/or strength of the magnetic locking force.

The first element and/or the second element, which may exclude the magnet, can be magnetic. In case the second element excludes the magnet, such second element can at least partially comprise a magnetic material. In this example, the second element may also be at least partially electrically conductive.

In case the substrate holder is configured to hold two substrates, the locking unit can be configured to switch the locking of both substrates on and off at the same time or independent of each other. In an example, the locking unit can therefore be configured to simultaneously lock both contact loops and the substrate holder with each other. In another example, the locking unit can be configured to independently lock each contact loop and the substrate holder with each other.

According to a further exemplary embodiment of the present disclosure, the first element and/or the second element which excludes the magnet, can comprise at least a magnetic contact finger. If the second element excludes the magnet, the second element can comprise several contact fingers made of magnetic material. In a further example, the second element can comprise several arrays of contact fingers to be arranged in contact with several magnets distributed at the first element.

If the first element holds the magnet, the first element can comprise at least an electrical conductor rod extending along the first element. In an example, one end of the contact fingers can contact the magnet, which can contact the electrical conductor rod.

The same being described of one of the first element and/or the second element can also apply to the other of the first element and/or the second element in case the functions of the first element and the second element are exchanged. The first element and the second element can also be mixed so that, e.g., each of the first element and/or the second element can be magnetic, and can comprise magnets working together.

In a still another exemplary embodiment of the present disclosure, the substrate locking system for chemical and/or electrolytic surface treatment of a substrate can further comprise a sealing unit arranged between the first element and the second element. The sealing unit can be configured to ensure a liquid-tight connection between the substrate, the first element and the second element. In an example, the sealing unit can comprise an inner sealing configured to ensure a liquid-tight connection between the substrate and the contact loop. In another example, the sealing unit can comprise an outer sealing configured to ensure a liquid-tight connection between the substrate holder and the contact loop. The inner and/or the outer sealing can be replaceable.

According to a further exemplary embodiment of the present disclosure, also a device for chemical and/or electrolytic surface treatment of a substrate in a process fluid is presented. The device for chemical and/or electrolytic surface treatment can comprise a substrate locking system as described herein and a distribution body.

The exemplary distribution body can be configured to direct a flow of the process fluid and/or an electrical current to the substrate. The distribution body can also correspond to the substrate to be treated in particular in view of its shape and size. The distribution system can further be or include a vertical distribution system with a vertical plating chamber, in which the substrate can be inserted vertically. The distribution system can also be or include a horizontal distribution system with a horizontal plating chamber, in which the substrate can be inserted horizontally.

The exemplary device for chemical and/or electrolytic surface treatment can further comprise a substrate holder. The substrate holder can be configured to hold the substrate. The substrate holder can be configured to hold one (single or dual side surface treatment) or two substrates (one substrate on each side of the substrate holder). The exemplary device for chemical and/or electrolytic surface treatment can further comprise one or two substrates.

The exemplary device for chemical and/or electrolytic surface treatment can further comprise an anode. The anode can be a multi-zone anode. Further, the exemplary device for chemical and/or electrolytic surface treatment can comprise a power supply. The exemplary device for chemical and/or electrolytic surface treatment can further comprise a process fluid supply.

According to yet another exemplary embodiment of the present disclosure, a substrate locking method for chemical and/or electrolytic surface treatment of a substrate in a process fluid can be provided. The exemplary method for chemical and/or electrolytic surface treatment comprises the following procedures/steps, which can be performed in the order below or in any other order:

arranging a substrate between a first element and a second element, and locking the first element and the second element with each other using a locking unit.

In a still further exemplary embodiment of the present disclosure, the locking unit can comprise a magnet control device and a magnet. The magnet can be arranged at one of the first element and the second element. The magnet control device can be configured to control a magnetic force between the first element and the second element.

The substrate locking method according to an exemplary embodiment of the present disclosure can facilitate an easy handling of the substrate(s) and the substrate holder. For example, the substrate(s) can be easily locked and held by the substrate holder and unlocked, and released.

The systems, devices and methods according to additional exemplary embodiments of the present disclosure can be used for processing structured semi-conductor substrates, conductor plates, film substrates, an entire surface of planar metal and metallized substrates, etc. The exemplary systems, devices and methods can also be used for a production of large surface photoelectric panels for solar energy generation, large-scale monitor panels and/or the like.

For example, the exemplary system, the exemplary device, and the exemplary method for chemical and/or electrolytic surface treatment of a substrate in a process fluid according to the exemplary embodiments of the present disclosure can have similar and/or identical exemplary interchangeable features. It shall be understood further that various embodiments herein can be used in any combination of the exemplary features and embodiments described herein.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which.

DETAILED DESCRIPTION OF EXEMPLARY EMBODIMENTS

Figure 1:
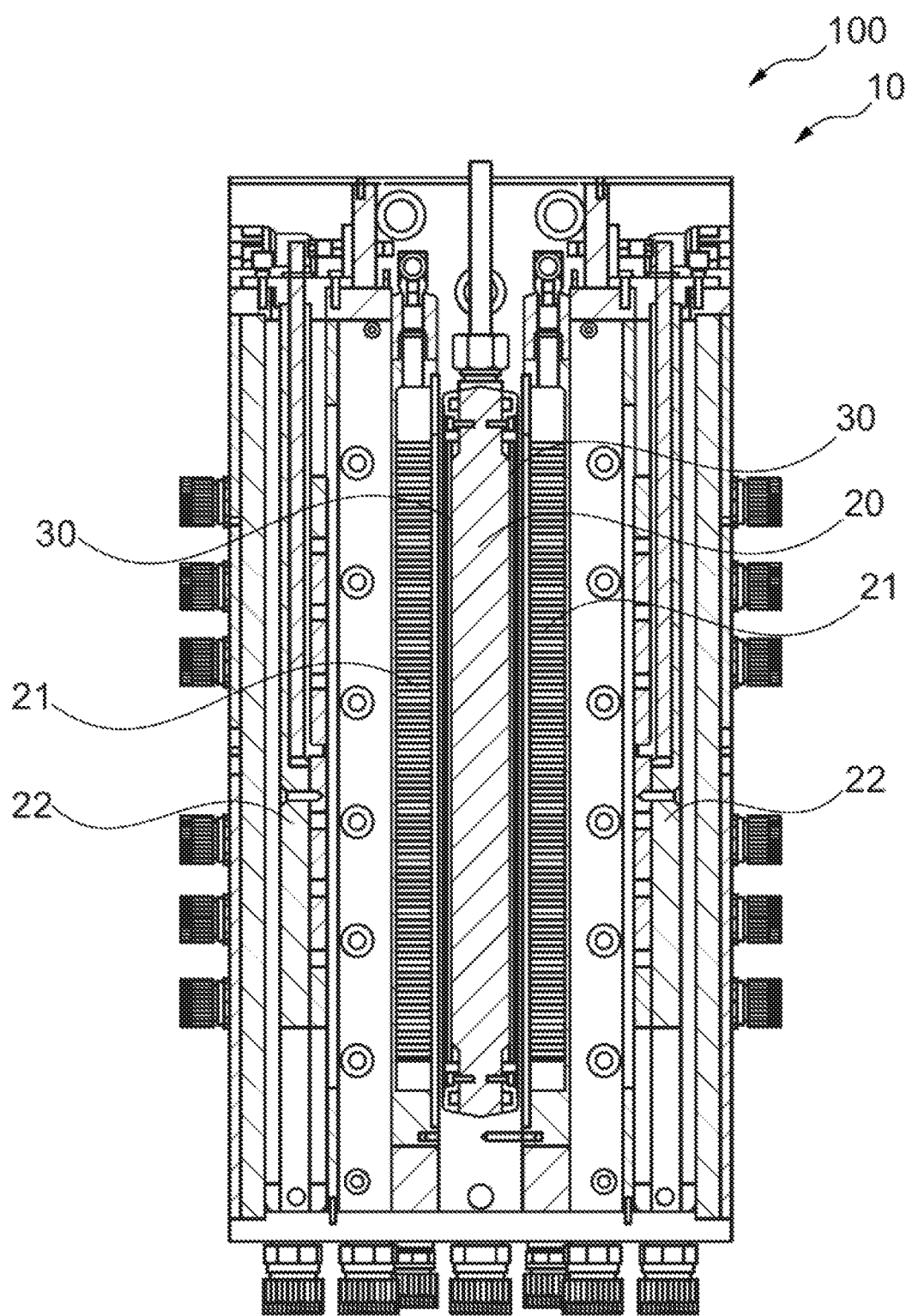
FIG. 1 is top cross-sectional view of a device for chemical and/or electrolytic surface treatment of a substrate in a process fluid according to an exemplary embodiment of the present disclosure.

FIG. 1 shows a top cross-sectional view of a device 100 for chemical and/or electrolytic surface treatment of a substrate 30 in a process fluid according to an exemplary embodiment of the present disclosure. The exemplary device 100 for chemical and/or electrolytic surface treatment can comprise a substrate locking system 10 for the chemical and/or electrolytic surface treatment of two or more substrates 30 in a process fluid. The substrates 30 can be hold or otherwise maintained by a substrate holder 20.

Figure 2:
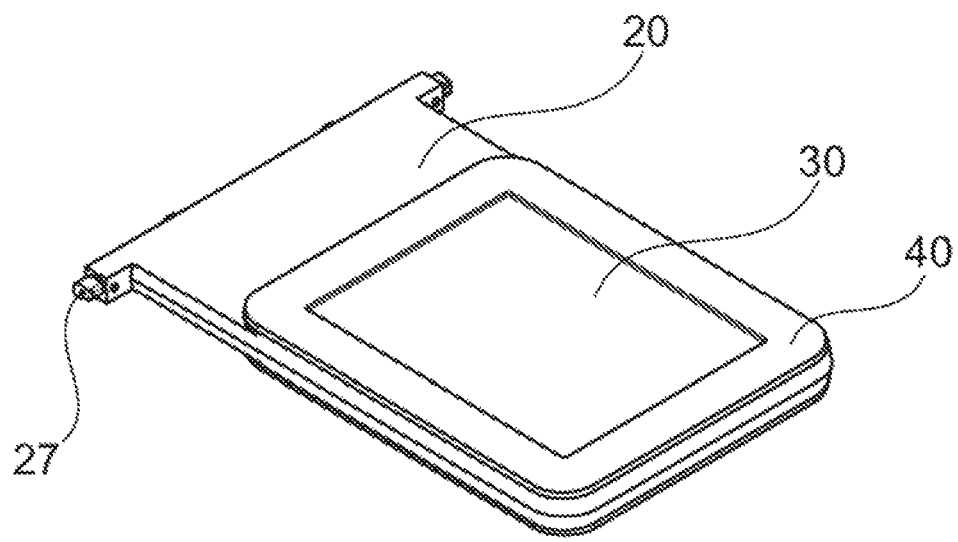
FIG. 2 is a perspective view of a substrate holder holding two substrates according to an exemplary embodiment of the present disclosure.
Figure 3:
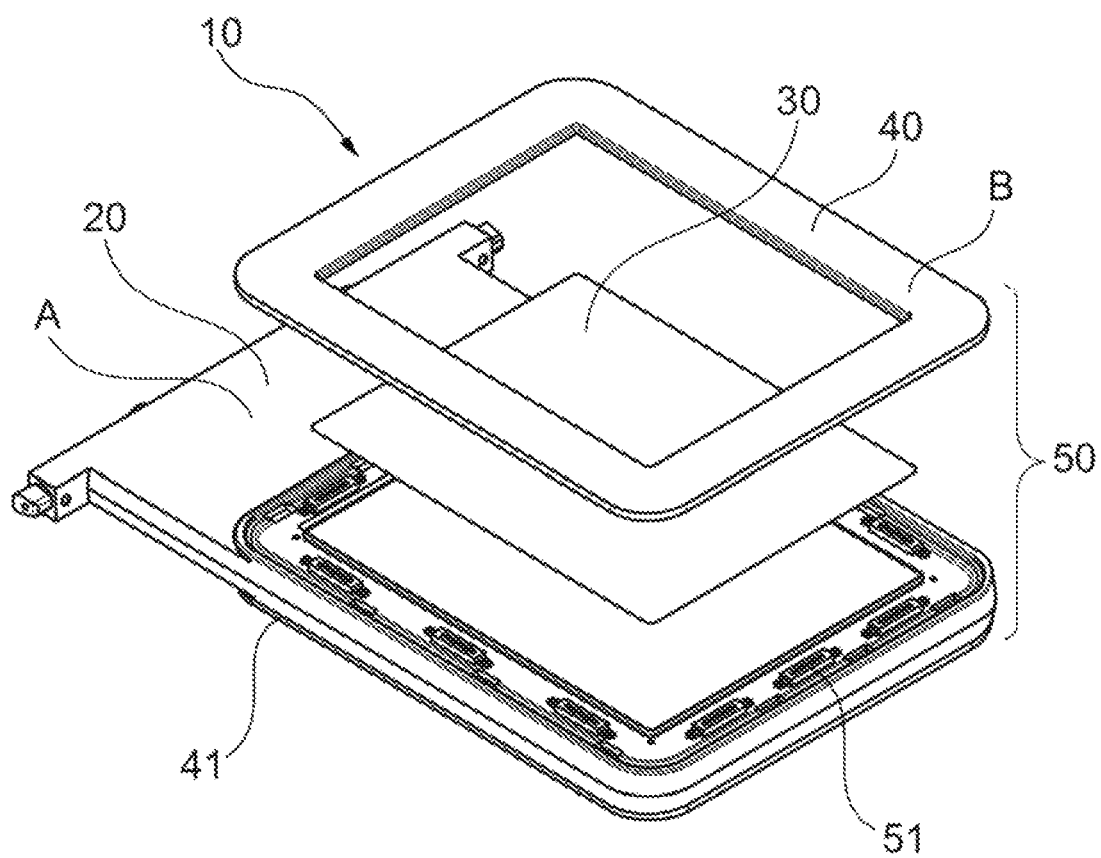
FIG. 3 is a perspective view of a substrate locking system for chemical and/or electrolytic surface treatment of the substrate in the process fluid according to an exemplary embodiment of the present disclosure.

FIG. 2 shows a perspective view of a substrate holder 20 holding two substrates according to an exemplary embodiment of the present disclosure. In particular, the exemplary substrate holder 20 is configured to hold one or two substrates 30, e.g., one substrate 30 on each side of the substrate holder 20. For example, the substrate holder 20 can hold rectangular substrates 30 with rounded corners and a size of, e.g., 370×470 mm. It should be understood and within the scope of the present disclosure that the device 100 for chemical and/or electrolytic surface treatment can also be used with a substrate holder 20, which can configured to hold only one substrate 30 for single or dual side surface treatment in a horizontal arrangement.

The substrate 30 can be or include, e.g., a plate-shaped work piece for the production of electric or electronic components, which can be mechanically fixed in the substrate holder 20, and the surface of which to be treated can be bathed in the process fluid as the treatment medium coming from a distribution body 21. In an exemplary case, the substrate 30 can be a masked and/or unmasked conductor plate, a semi-conductor substrate, or a film substrate, and/or any metal or metallized workpiece having an approximately planar surface.

Referring back to FIG. 1, the device 100 for chemical and/or electrolytic surface treatment can further comprise a distribution body 21. The distribution body 21 can produce targeted flow and current density patterns for the chemical and/or electrolytic surface treatment, and can be submerged in the process fluid (not shown). Opposite of each distribution body 21, the substrate 30 can be provided that can be attached to the substrate holder 20. The surface of the substrate 30 can be wetted by the process fluid. The distribution body 21 can comprise a plurality of distribution openings (not shown) directed of the substrate 30. The plurality of distribution openings can comprise outlet openings to direct a flow of process fluid to the substrate 30 and/or backflow openings to receive a backflow of process fluid from the substrate 30. The substrate 30 can act as a counter electrode to the anode or, e.g., as a cathode. The distribution body 21 can comprise plastic, including, e.g., polypropylene, polyvinyl chloride, polyethylene, acrylic glass, i.e. polymethyl methacrylate, polytetrafluoroethylene, and/or another material that would likely not be decomposed by the process fluid.

The exemplary device 100 for chemical and/or electrolytic surface treatment can further comprise anodes 22 that can each be located on a side of one of the distribution bodies 21 opposite of the substrate 30 and are also bathed in the process fluid. Each anode 22 can be attached in a rear region of the respective distribution body 21, in mechanical contact with, or spatially separated from, the distribution body 21 such that the electric current flow is carried out between the anode 22 and the substrate 30 acting as counter electrode within the process fluid. Depending on the surface treatment method used, the anode 22 may comprise a material that is insoluble in the process liquid, such as platinizied titanium, or otherwise a soluble material, such as for example, the metal to be galvanically separated.

FIGS. 3 to 6 show various views of a substrate locking system 10 for chemical and/or electrolytic surface treatment of the substrate 30 in the process fluid according to exemplary embodiments of the present disclosure. The exemplary substrate locking system 10 can comprise a first element A, a second element B and a locking unit 50.

The first element A and the second element B can be configured to hold the substrate 30 between each other. The first element A can be or include the substrate holder 20, and the second element B can be or include a contact ring or contact loop 40. The substrate locking system 10 can further comprises an additional contact loop 41 holding an additional substrate 30 between a reverse side of the substrate holder 20 and the additional contact loop 41 (as also shown in is detailed cross-sectional view in FIG. 5). The substrate holder 20 can hold two substrates 30, one on each side of the substrate holder 20.

The locking unit 50 can be configured to lock the first element A, the substrate holder 20, and the second element B, the contact loop 40, with each other. The locking unit 50 can comprise a magnet control device/unit/arrangement (not shown) and several magnets 51 arranged at and distributed along the first element A, and the substrate holder 20. The magnet control device/unit/arrangement can control a magnetic force between the first element A, the substrate holder 20, and the second element B, the contact loop 40, to close, lock and hold the substrate 30 or to unlock, open and release the substrate 30 from the substrate holder 20. As a result, the substrate locking system 10 according to the exemplary embodiments of the present disclosure can facilitate an easy and flexible handling of the substrate 30 and the substrate holder 20.

The magnets 51 can be, e.g., permanent magnets distributed along the substrate holder 20, while the contact loop 40 is made of a magnetic material. The magnet control device/unit/arrangement can control the magnetic force between the first element A (e.g., the substrate holder 20) and the second element B (e.g., the contact loop 40) by applying a voltage.

Figure 4:
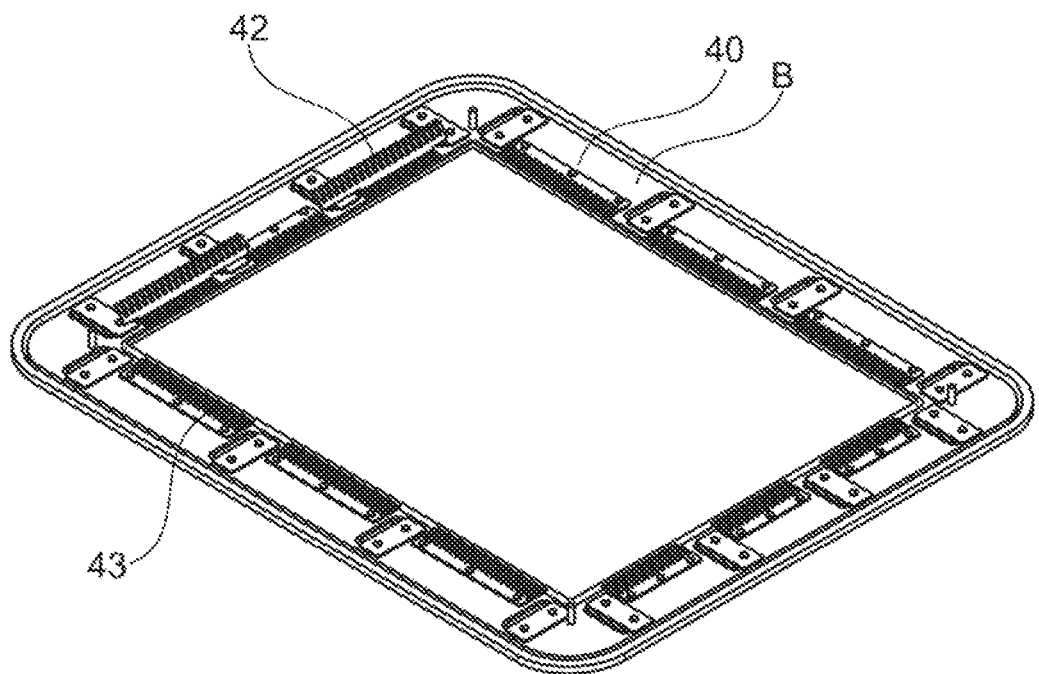
FIG. 4 is a perspective view of a second element of the substrate locking system according to an exemplary embodiment of the present disclosure.

FIG. 4 shows a perspective view of the second element B according to an exemplary embodiment of the present disclosure, which can be or include the contact loop 40. The contact loop 40 can comprise several arrays of magnetic contact fingers 42, which can be, in a closed configuration, in contact with the magnets 51 distributed along the substrate holder 20. The contact fingers 42 can be positioned upright or standing. The contact loop 40 can further comprise several arrays of contact fingers 43, which can be in contact with the substrate 30, and may therefore be positioned as planar or lying.

Figure 5:
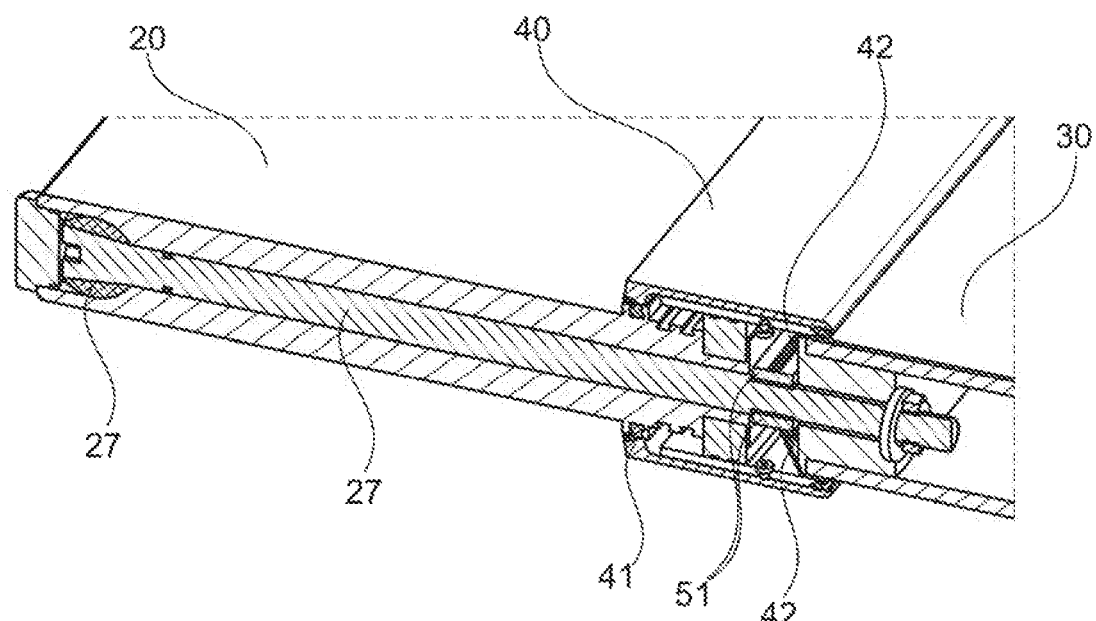
FIG. 5 is a cross-sectional view of a portion of the substrate holder shown in FIG. 2.

FIG. 5 shows a cross-section of a portion of the substrate holder 20 which is illustrated in FIG. 2. For example, electrical conductor rods 27 can at least partially extend along at least some of the four edges of the substrate holder 20. For example, a first conductor rod 27 can extend along a longer side of the substrate holder 20, and can meet in a corner a second conductor rod 27 extending along a shorter side of the substrate holder 20. A free end of the contact finger array 42 can contact the magnet 51 at the substrate holder 20, which can contact the electrical conductor rod 27.

Figure 6:
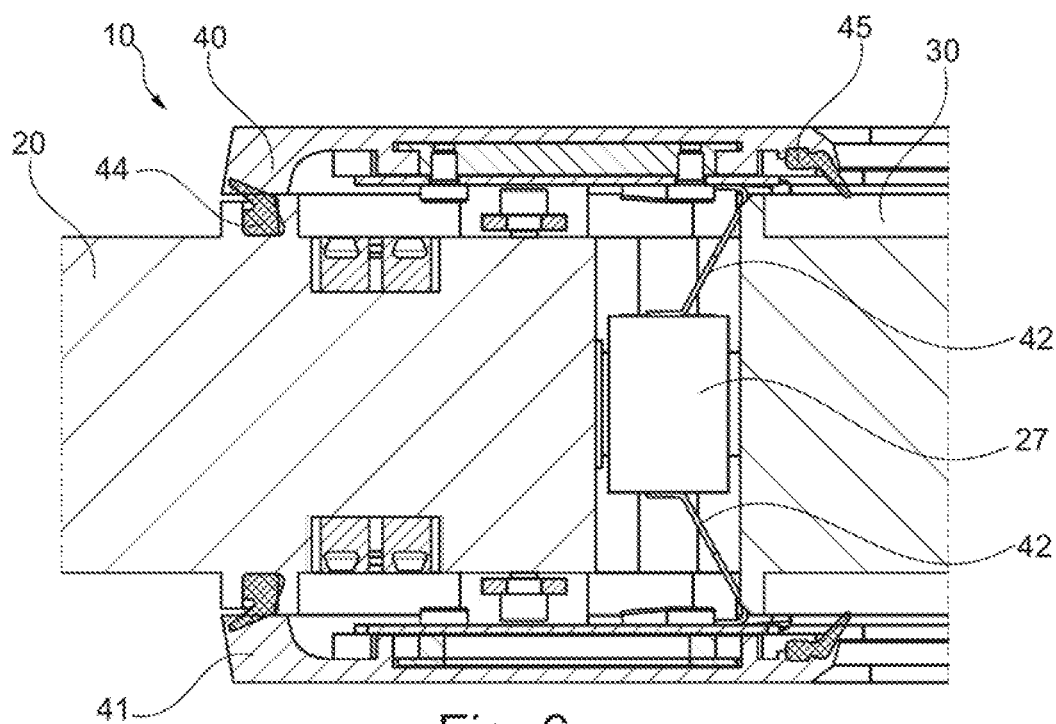
FIG. 6 is a closer cross-sectional view of a portion of the substrate locking system according to an exemplary embodiment of the present disclosure.

FIG. 6 shows a closer cross-section of a portion of the substrate locking system 10. Such exemplary portion can further comprise a sealing unit 44 45. The sealing unit 44 can comprise an outer sealing 44, which can be positioned between the contact loop 40 and the substrate holder 20, and can ensure a liquid-tight connection between the first element A and the second element B. The substrate locking system 10 can further comprise an inner sealing 45, which can be provided between the contact loop 40 and the substrate 30, and can ensure a liquid-tight connection between the substrate 30 and the second element B.

Figure 7:
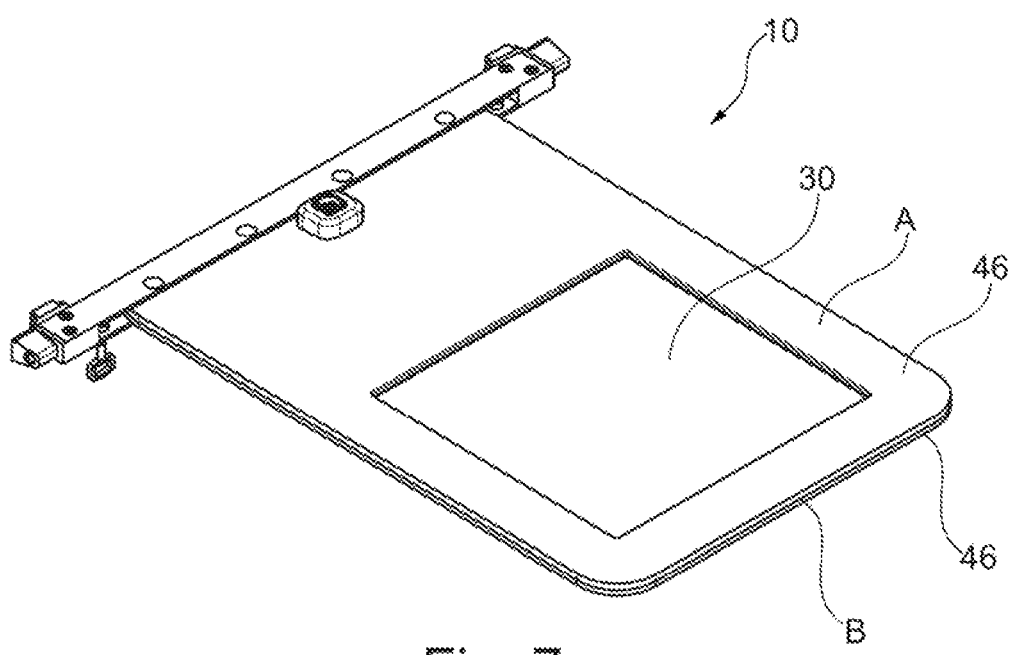
FIG. 7 is a perspective view of a substrate locking system for chemical and/or electrolytic surface treatment of the substrate in the process fluid according to another exemplary embodiment of the present disclosure.
Figure 8:
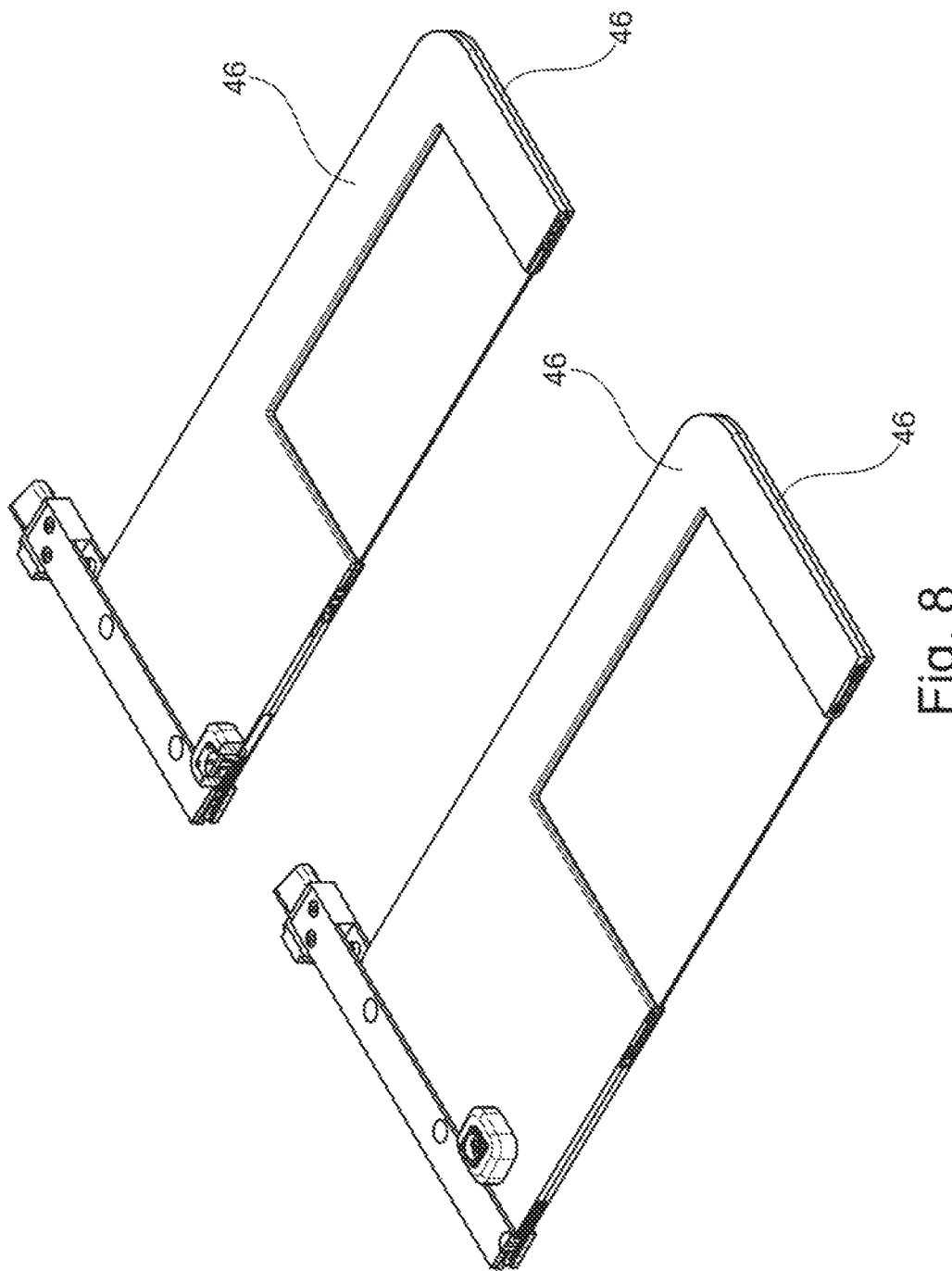
FIG. 8 is set of perspective views of the substrate locking system of FIG. 7 according to the further exemplary embodiment of the present disclosure.
Figure 9:
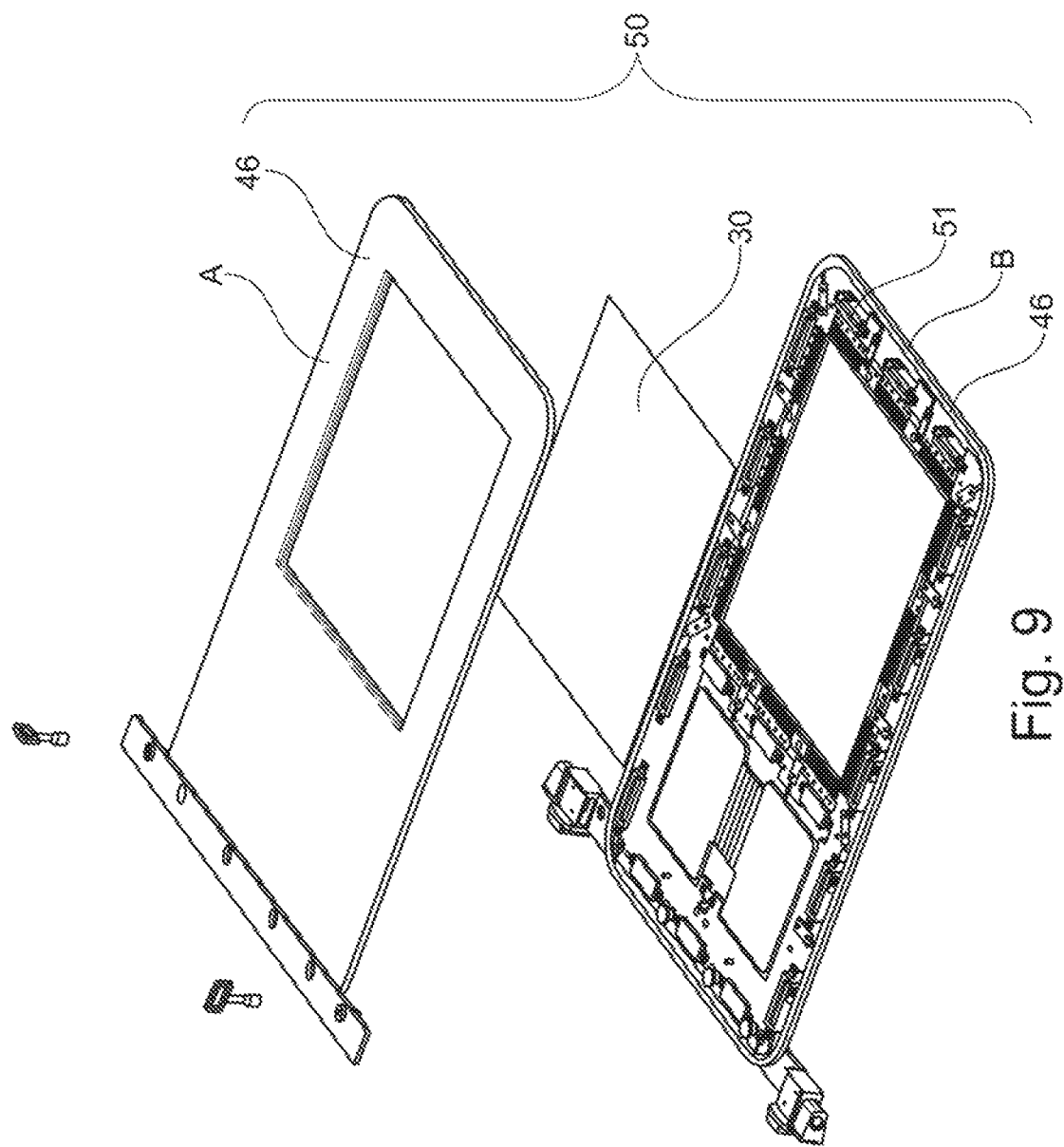
FIG. 9 is set of perspective exploded views of the exemplary substrate locking systems shown in FIGS. 7 and 8.

FIGS. 7 to 9 show perspective views of a substrate locking system 10 for chemical and/or electrolytic surface treatment of the substrate 30 in the process fluid according to another exemplary embodiment the present disclosure. The exemplary substrate locking system 10 can comprises a first element A, a second element B and a locking unit 50.

The first element A and the second element B can be or include two contact rings 46, respectively, holding one substrate 30 between them. In this example, the substrate holder can be excluded. The two contact rings 46 can hold a single substrate 20 for dual side surface treatment. The two contact rings 46 can be provided with a recess to make the substrate 20 accessible from both sides.

The locking unit 50 can lock the first element A and the second element B with each other. The locking unit 50 can comprise a magnet control device/unit/arrangement (not shown) and several magnets 51 arranged at and distributed along the first element A, one of the two contact rings 46. The magnet control device/unit/arrangement can control a magnetic force between the two contact rings 46 as first element A and second element B to close, lock and hold the substrate 30 or to unlock, open and release the substrate 30. As a result, the substrate locking system 10 according to an exemplary embodiment of the present disclosure can facilitate an easy and flexible handling of the substrate 30.

The magnets 51 can be permanent magnets distributed along one of the contact rings 46, and the other of the contact rings 46 can be made of a magnetic material. The magnet control device/unit/arrangement can control the magnetic force between the contact rings 46 by applying a voltage.

Figure 10:
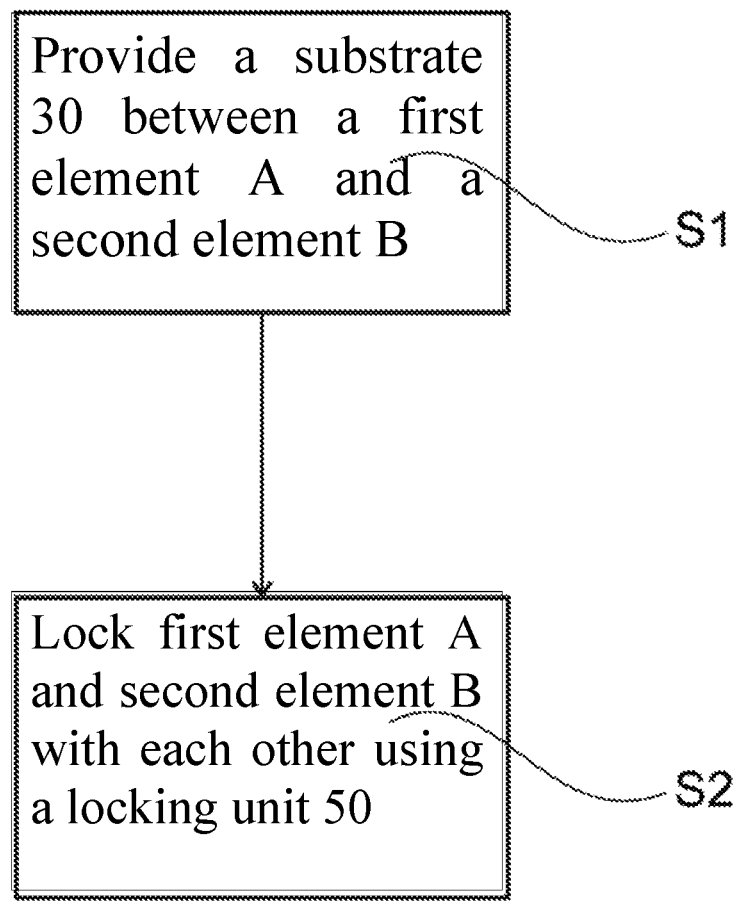
FIG. 10 is a flow diagram of a distribution method for chemical and/or electrolytic surface treatment of a substrate in a process fluid according to an exemplary embodiment of the present disclosure.

FIG. 5 shows a flow diagram a distribution method for chemical and/or electrolytic surface treatment of a substrate 30 in a process fluid according to an exemplary embodiment of the present disclosure. The exemplary method for chemical and/or electrolytic surface treatment illustrated in FIG. 10 has the following procedures/step:

In a first step S1, arranging a substrate 30 between a first element A and a second element B.

In a second step S2, locking the first element A and the second element B with each other using a locking unit 50.

The locking unit 50 can comprise a magnet control and at least a magnet 51. The magnet 51 can be arranged at one of the first element A and the second element B. The magnet control device/unit/arrangement can be configured to control a magnetic force between the first element A and the second element B.

The exemplary systems, devices and methods are suitable, in particular, for the processing of structured semi-conductor substrates, conductor plates, and film substrates, as well as for processing of the entire surface of planar metal and metallized substrates. Exemplary device and methods can also be used according to various exemplary embodiments of the present disclosure for the production of large surface photoelectric panels for solar energy generation, and/or large-scale monitor panels.

It has to be noted that embodiments of the present disclosure are described with reference to different subject matters. In particular, some embodiments are described with reference to method type claims whereas other exemplary embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. All features can be combined providing synergetic effects that are more than the simple summation of the features.

While the exemplary embodiments of the present disclosure have been illustrated and described in detail in the drawings and foregoing description, such illustrations and descriptions are to be considered illustrative or exemplary and not restrictive. The present disclosure is not limited to the disclosed embodiments. Other variations to the disclosed exemplary embodiments can be understood and effected by those skilled in the art in practicing the present disclosure provided herein, from a review of the drawings, the disclosure, and the claims.

In the claims, the word "comprising" does not exclude other elements or steps, and the indefinite article "a" or "an" does not exclude a plurality. A single computer processor or other unit may fulfil the functions of several items re-cited in the claims. The mere fact that certain measures are re-cited in mutually different dependent claims does not indicate that a combination of these measures cannot be used to advantage.

What is claimed is:

1. A substrate locking system for at least one of a chemical surface treatment or a electrolytic surface treatment of a substrate in a process fluid, comprising:
    a first element and a second element, wherein the first element and the second element are configured to hold or maintain the substrate between each other; and
    a locking arrangement configured to lock the first element and the second element with each other,
    wherein the locking arrangement comprises a magnet control device and a plurality of magnets distributed at or near the first element along the substrate to be held,
    wherein at least one of the magnets is arranged at or near at least one of the first element or the second element, and
    wherein the magnet control device is configured to control a magnetic force between the first element and the second element.

2. The substrate locking system according to claim 1, wherein the first element is a first contact ring, and the second element is a second contact ring, and wherein the first and second contact rings are configured to hold at least one substrate between each other.

3. The substrate locking system according to claim 1, wherein the first element is a substrate holder, and the second element is a contact loop, and wherein the substrate holder and the contact loop are configured to hold at least one substrate between each other.

4. The substrate locking system according to claim 3, further comprising a further contact loop configured to hold a further substrate between a reverse side of the substrate holder and the further contact loop.

5. The substrate locking system according to claim 4, wherein the locking arrangement is configured to simultaneously or independently lock the contact loop, the further contact loop and the substrate holder with each other.

6. The substrate locking system according to claim 1, wherein the at least one of the magnets is arranged at or near the first element.

7. The substrate locking system according to claim 1, wherein the at least one of the magnets is a permanent magnet configured to lock the first element to the second element.

8. The substrate locking system according to claim 7, wherein the magnet control device is configured to reduce or eliminate the magnetic force of the permanent magnet to facilitate a release of the second element from the first element.

9. The substrate locking system according to claim 7, wherein the magnet control device is configured to control the magnetic force between the first element and the second element by applying a voltage.

10. The substrate locking system according to claim 1, wherein the second element at least partially comprises a magnetic material.

11. The substrate locking system according to claim 1, wherein the second element is at least partially electrically conductive.

12. The substrate locking system according to claim 1, wherein the second element comprises a plurality of contact fingers made of magnetic material.

13. The substrate locking system according to claim 12, wherein the first element comprises an electrical conductor rod extending along the first element.

14. The substrate locking system according to claim 1, further comprising a sealing arrangement provided between the first element and the second element, wherein the sealing arrangement is configured to ensure a liquid-tight connection between the substrate, the first element and the second element.

15. The substrate locking system according to claim 14, wherein the first element is a substrate holder, and the second element is a contact loop, wherein the substrate holder and the contact loop are configured to hold at least one substrate between each other, wherein the sealing arrangement comprises (i) an inner sealing configured to ensure a liquid-tight connection between the substrate and the contact loop, and (ii) an outer sealing configured to ensure a liquid-tight connection between the substrate holder and the contact loop.

16. A substrate locking system for at least one of a chemical surface treatment or a electrolytic surface treatment of a substrate in a process fluid, comprising:

a first element and a second element, wherein the first element and the second element are configured to hold or maintain the substrate between each other; and a locking arrangement configured to lock the first element and the second element with each other, wherein the locking arrangement comprises a magnet control device, wherein the second element comprises arrays of contact fingers arranged in contact with a plurality of magnets distributed at or near the first element, wherein at least one of the magnets is arranged at or near at least one of the first element or the second element, and wherein the magnet control device is configured to control a magnetic force between the first element and the second element.

17. A substrate locking system for at least one of a chemical surface treatment or a electrolytic surface treatment of a substrate in a process fluid, comprising:

a first element and a second element, wherein the first element and the second element are configured to hold or maintain the substrate between each other; and a locking arrangement configured to lock the first element and the second element with each other, wherein the locking arrangement comprises a magnet control device and a magnet, wherein the magnets is arranged at or near at least one of the first element or the second element, and wherein the magnet control device is configured to control a magnetic force between the first element and the second element, wherein the first element comprises an electrical conductor rod extending along the first element, wherein the second element comprises a plurality of contact fingers made of magnetic material, and wherein one end of the contact fingers contacts the magnet, and wherein the magnet contacts the electrical conductor rod.

* * * * *